United States Patent
Iwamoto et al.

(10) Patent No.: US 7,482,234 B2
(45) Date of Patent: Jan. 27, 2009

(54) METHOD OF FABRICATING A METAL OXYNITRIDE THIN FILM THAT INCLUDES A FIRST ANNEALING OF A METAL OXIDE FILM IN A NITROGEN-CONTAINING ATMOSPHERE TO FORM A METAL OXYNITRIDE FILM AND A SECOND ANNEALING OF THE METAL OXYNITRIDE FILM IN AN OXIDIZING ATMOSPHERE

(75) Inventors: Kunihiko Iwamoto, Kyoto (JP); Koji Tominaga, Kyoto (JP); Toshihide Nabatame, Tokyo (JP); Tomoaki Nishimura, Shiga (JP)

(73) Assignees: Rohm Co., Ltd. (JP); Horiba, Ltd. (JP); Renesas Technology Corp. (JP)

( * ) Notice: Subject to any disclaimer, the term of this patent is extended or adjusted under 35 U.S.C. 154(b) by 96 days.

(21) Appl. No.: 10/928,045

(22) Filed: Aug. 27, 2004

(65) Prior Publication Data
US 2005/0116306 A1    Jun. 2, 2005

(30) Foreign Application Priority Data
Nov. 28, 2003    (JP)    ............................... 2003-399459

(51) Int. Cl.
*H01L 21/473* (2006.01)
(52) U.S. Cl. .................. 438/287; 438/591; 438/785
(58) Field of Classification Search .................. 438/785
See application file for complete search history.

(56) References Cited

U.S. PATENT DOCUMENTS

| | | | |
|---|---|---|---|
| 7,144,825 B2 * | 12/2006 | Adetutu et al. ............... | 438/763 |
| 2002/0149065 A1 * | 10/2002 | Koyama et al. ............. | 257/389 |
| 2003/0194853 A1 * | 10/2003 | Jeon ........................... | 438/591 |
| 2004/0043569 A1 * | 3/2004 | Ahn et al. .................... | 438/287 |
| 2004/0048491 A1 * | 3/2004 | Jung et al. ................... | 438/785 |

FOREIGN PATENT DOCUMENTS

| | | |
|---|---|---|
| JP | 2002-299607 | 10/2002 |
| JP | 2004-336057 A | 11/2004 |
| WO | 03-081667 A1 | 10/2003 |

OTHER PUBLICATIONS

Japanese Office Action for Patent Application No. 2003-399459 (with English Translation) mailed Jan. 8, 2008.

* cited by examiner

*Primary Examiner*—Stephen W Smoot
(74) *Attorney, Agent, or Firm*—Cantor Colburn LLP

(57) ABSTRACT

After the surface of the substrate is cleaned, an interface layer or an antidiffusion film is formed. A metal oxide film is built upon the antidiffusion film Annealing is done in an $NH_3$ atmosphere so as to diffuse nitrogen in the metal oxide film. Building of the metal oxide film and diffusion of nitrogen are repeated several times, whereupon annealing is done in an $O_2$ atmosphere. By annealing the film in an $O_2$ atmosphere at a temperature higher than 650° C., the leak current in the metal oxide film is controlled.

4 Claims, 9 Drawing Sheets

|  | FIRST EXAMPLE | SECOND EXAMPLE | THIRD EXAMPLE | FOURTH EXAMPLE | FIFTH EXAMPLE |
|---|---|---|---|---|---|
| $NH_3$ ANNEALING TEMPERATURE | 650°C | 750°C | 850°C | 950°C | 850°C |
| $O_2$ ANNEALING TEMPERATURE | 650°C | 650°C | 650°C | 650°C | 850°C |
| NITROGEN CONTENT (ATOMIC %) | 2% | 10% | 13% | 17% | 10~11% |

○ METAL ATOMS   ⊘ OXYGEN ATOMS   ● IMPURITIES

METHOD OF FABRICATING A METAL OXYNITRIDE THIN FILM THAT INCLUDES A FIRST ANNEALING OF A METAL OXIDE FILM IN A NITROGEN-CONTAINING ATMOSPHERE TO FORM A METAL OXYNITRIDE FILM AND A SECOND ANNEALING OF THE METAL OXYNITRIDE FILM IN AN OXIDIZING ATMOSPHERE

BACKGROUND OF THE INVENTION

1. Field of the Invention

The present invention relates to a method of fabricating a metallic compound thin film and a semiconductor device including the metallic compound thin film and a method of fabricating the same.

2. Description of the Related Art

Conventionally, a silicon oxide film, characterized by excellent leak current characteristics and low interface state density, has been used as a gate insulator of a MOSFET. There is a problem, however, that, as the thickness of the gate insulator is decreased in a transistor having a gate insulator formed of a silicon oxide film, as a result of reduction in device size, the gate leak current resulting from a tunnel current is increased. As the gate leak current is increased, a substantial leak current is produced at turn-off, resulting in an abnormal operation of the semiconductor device or an increase in power consumption. Some study has been made in recent years of using a high-K gate dielectric material such as metal oxide to form a gate insulator.

A high-K dielectric metal oxide film is easily turned into a multicrystal. Therefore, diffusion of impurities and increase in a leak current easily occur across a grain boundary. As a result, impurities or metallic atoms doped in the gate electrode penetrate the high-K gate dielectric material to reach the channel region, thereby impairing the characteristics and reliability of the device.

Atomic layer deposition (ALD) is known as a promising method for forming a high-K gate dielectric material of a transistor. One problem with ALD is that materials used in the ALD method may remain the high-K gate dielectric material as impurities and also induce defects of the film. Another problem is that the stoichiometric mixture ratio of the film constituting the high-K gate dielectric material deviates from the designed value so that desired film characteristics cannot be obtained. A description will be given of these phenomena by referring to FIGS. 10A and 10B. FIGS. 10A and 10B are schematic diagrams showing a layer structure resulting when a high-K gate dielectric material is formed by the ALD method. FIG. 10A shows a state prior to a treatment for improvement of the film quality by thermal annealing and FIG. 10B shows a state after the treatment. As shown in FIG. 10A, prior to the thermal annealing, impurities are distributed evenly in the high-K gate dielectric material. After the annealing, impurities are generally removed from the film. Also, the film is turned into a closely-packed state. However, due to insufficient removal, impurities remain in the lower part of the high-K gate dielectric material, especially in the neighborhood of the substrate. The impurities that remain and the crystallization of the film give rise to degradation of the device that includes the high-K gate dielectric material. For example, an increase in a leak current or a variation in threshold characteristics is caused.

Patent document No. 1 describes a construction in which nitrogen is introduced into a high-K gate dielectric of a MIS transistor. More specifically, it describes a method of heating a high-K gate dielectric material in an ammonia atmosphere and forming a diffusion barrier layer on top of the film. The document also describes a method of localizing, by segregation, nitrogen at the interface between the high-K gate dielectric material and the silicon nitride film, by forming a silicon nitride film on top of the high-K gate dielectric material and subjecting the film to a thermal treatment (paragraphs 0043 and 0046). By employing such a method, impurities and metallic atoms are prevented from being diffused away from the gate electrode.

Related Art List (1) Japanese Laid-Open Patent Application No. 2002-299607

However, the method described in the document is directed to the localizing of nitrogen in the upper part of the film and does not add any valid knowledge directed to a method of increasing the percentage content of nitrogen. Further, the benefit of restricting penetration of elements such as boron in the gate electrode is limited. Moreover, no solution is provided to the problem, described by referring to FIGS. 10A and 10B, of degradation in the transistor due to the crystallization of high-K gate dielectric material and the impurities that remain.

SUMMARY OF THE INVENTION

The present invention has been done in view of the above-described circumstances and its object is to provide a semiconductor device provided with a highly reliable metallic compound film having a high dielectric constant and characterized by little likelihood of impurities and metals being diffused. Another object of the present invention is to provide a method of fabricating a metallic compound thin film containing nitrogen suitably used in the above-described semiconductor device. The present invention provides a method of fabricating a metal compound thin film comprising the steps of: forming a metal oxide film by an atomic layer deposition method; a first annealing in which the metal oxide film in an atmosphere including a nitrogen compound gas is annealed, so as to diffuse nitrogen in the metal oxide film and form a metal oxynitride film; and a second annealing in which the metal oxynitride film is annealed in an atmosphere including an oxidizing gas at a temperature higher than 650° C. A nitrogen compound gas may be a gas that contains ammonia, hydrazine or dimethylhydrazine. An oxidizing gas may be a oxygen-containing gas that contains oxygen, NO, $N_2O$ or the like.

The first annealing in an atmosphere including a nitrogen compound gas diffuses nitrogen in a metal oxide film and forms a metal oxynitride film. By increasing the temperature at the first annealing, the percentage content of nitrogen in the metal oxide film is increased. The inventors of the present invention have found that a new problem arises in that, when the percentage content of nitrogen in the metal oxide film is increased, a leak current is enlarged. By performing the second annealing in the temperature range described above, it is ensured that the film quality of the metal oxide film is proper and the leak current is controlled. The leak current is controlled presumably because, by subjecting the film to the second annealing in the temperature range described above, generation of bonding of metal nitrides that induces conductivity, a cause of a leak path, is controlled, and because defects that occur in the film are filled by oxygen atoms so that the film quality is improved. According to the invention, by introducing nitrogen by ammonia annealing and annealing the film using an oxidizing gas, the film quality is improved.

The first annealing may be performed at a temperature higher than 650 in a process of diffusing nitrogen.

By performing the first annealing in this temperature range, the percentage content of nitrogen in the metal oxide film is increased. By performing annealing using a nitrogen compound gas, nitrogen is diffused in the metal oxide film. A structure results in which oxygen atoms and nitrogen atoms are located around metals. Crystallization of the metal oxide film is prevented. By performing the first annealing in this temperature range, it is ensured that the metallic compound thin film is in an amorphous state. This makes it possible to form a thermally stable high-K gate dielectric material even when the metallic compound thin film is provided on a semiconductor substrate. The present invention provides a method of fabricating a metallic compound thin film comprising the steps of: forming a metal oxide film on a substrate by an atomic layer deposition method; a first annealing in which the metal oxide film is annealed in an atmosphere including a nitrogen compound gas at a temperature higher than 650° C., so as to diffuse nitrogen in the metal oxide film and form a metal oxynitride film; and a second annealing in which the metal oxynitride film is annealed in an atmosphere including an oxidizing gas. The step of forming the metal oxide film and the step of forming the metal oxynitride film may be repeated several times, whereupon the second annealing is performed.

With this, a low dielectric constant layer at the interface between the metal oxynitride film and the silicon substrate underneath is prevented from being formed. Moreover, nitrogen is diffused evenly in the metallic compound thin film so that the diffusion barrier effect for restricting diffusion of elements such as boron in the gate electrode is improved.

The metal oxide film may include elements selected from a group comprising Hf, Zr, Al, Si, Y and lanthanoids.

By using a material as this, it is ensured that the metallic compound thin film has a high dielectric constant. For example, even when the physical thickness of a gate insulator of a transistor is increased, the corrected thickness is reduced. Of the listed elements, transition metals such as Hf, Zr, Y and lanthanoids are most favorably used. Since a transition metal is characterized by loose bonding with other atoms, nitrogen is properly introduced therein by the first annealing. Also, it is possible to introduce oxygen properly by the second annealing. Consequently, the film quality is improved.

The present invention provides a method of fabricating a semiconductor device including a step of forming a metallic compound thin film on a semiconductor substrate, wherein the metallic compound thin film is formed by any of the methods as described above. The metallic compound thin film of the present invention may be used as a gate insulator or a capacitor insulator of a transistor.

The present invention provides a method of fabricating a semiconductor device comprising the steps of: forming a gate insulator and a conductive film on a semiconductor substrate in the stated order; and patterning the gate insulator and the conductive film so as to form a gate part, wherein the gate insulator is formed by any of the methods as described above.

The present invention provides a metallic compound thin film in which at least Hf, N and O are included, the density of nitrogen in the film is 5 atomic percent or higher, two X-ray photoelectron spectroscopy spectral peaks occur in binding energy ranges 17.5-18.5 eV and 19.5-20.5 eV of an Hf4f, and a spectral peak at 15-17 eV does not occur. The present invention provides a semiconductor device which includes a metallic compound thin film formed on a semiconductor substrate, wherein at least Hf, N and O are included in the metallic compound thin film, the density of nitrogen in the film is 5 atomic percent or higher, two X-ray photoelectron spectroscopy spectral peaks occur in binding energy ranges 17.5-18.5 eV and 19.5-20.5 eV of an Hf4f, and a spectral peak at 15-17 eV does not occur.

According to the present invention, the density of nitrogen in the layered film is 5 atomic percent or higher in each layer. More preferably, the density may be 10 atomic percent or higher.

As described above, according to the present invention, it is possible to obtain a semiconductor device provided with a reliable metallic compound thin film having a high insulation and providing a diffusion barrier effect.

According to the present invention, a metallic compound thin film suitably used in the semiconductor device is fabricated in a stable manner.

DETAILED DESCRIPTION OF THE INVENTION

Figure 1A:
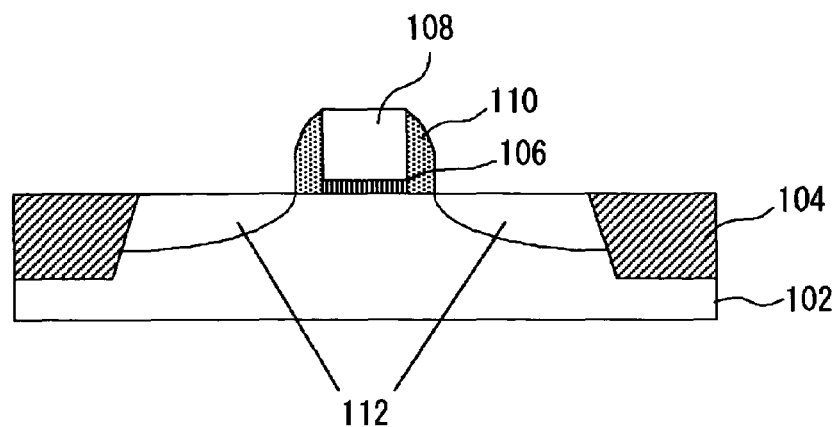
FIGS. 1A-1B schematic diagrams showing a construction of a MIS transistor according to an embodiment of the present invention.
Figure 1B:
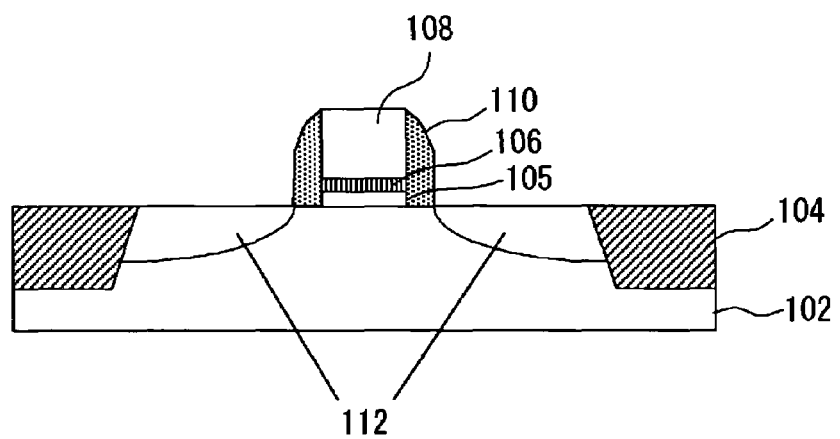

FIGS. 1A-1B are schematic diagrams showing a construction of a MIS transistor according to an embodiment of the present invention. As shown in FIG. 1A, the transistor is formed in an element region isolated by an element isolating film 104 on the surface of a silicon substrate 102. A gate electrode 108 is formed on the surface of the silicon substrate 102 via a high-K gate dielectric material 106. A side wall 110 is formed lateral to the gate electrode 108. A pair of source and drain 112 is formed below those portions of the surface of the silicon substrate 102 immediately beside the gate electrode 108.

In the embodiment, the high-K gate dielectric material 106 is formed of a metal oxide film including nitrogen. When nitrogen is introduced in the metal oxide film, the crystal temperature becomes higher, and the thermal and chemical stability is improved. By increasing the density of nitrogen in the film, dispersion of impurities in the gate electrode in the metal oxide film is blocked.

When the density of nitrogen in the film is increased, the film is stabilized thermally and chemically. By allowing nitrogen to react with the silicon film or the silicon oxide film, the likelihood of alloy being formed is decreased. Generally, when the gate insulator formed of a high-K dielectric material is provided, the high-K dielectric material and silicon react with each other to form a silicide thin film or a silicate thin film, causing the dielectric constant to drop and the corrected film thickness to increase. According to the embodiment, these problems are resolved by increasing the percentage content of nitrogen in the high-K gate dielectric material 106.

As shown in FIG. 1B, the transistor may be constructed such that an antidiffusion film 105 is provided between the silicon substrate 102 and the high-K gate dielectric material 106. By employing this construction, the film quality of the high-K gate dielectric material 106 is improved. Further, formation of a silicide thin film or a silicate thin film at the interface between the silicon substrate 102 and the high-K gate dielectric material 106 as a result of reaction of nitrogen with the substrate or the gate material, is more successfully restricted. A nitride film or an oxynitride film may be used as the antidiffusion film 105. For example, a silicon nitride ($Si_3N_4$) film, an AlN film, an aluminum oxynitride film (AlON), a silicon oxynitride film may be used. When silicon nitride is used to form the antidiffusiion film 105, the silicon substrate 102 is annealed for about 30 seconds at about 700-800° C. in an ammonia atmosphere, for example. In this way, the antidiffusion film 105 of a physical thickness of about 0.3-1.0 nm.

Figure 2A:
FIGS. 2A-2E shows a process of fabricating a transistor shown in FIG. 1A.
Figure 2B:
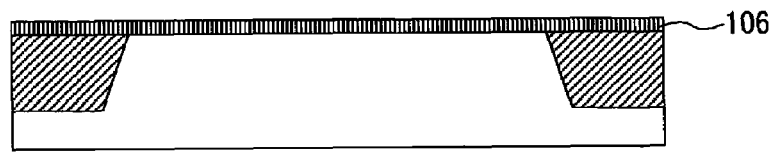

FIGS. 2A-2E shows a process of fabricating a transistor shown in FIG. 1A. As shown in FIG. 2A, an element isolating film 104 of a shallow trench isolation (STI) structure is provided in the silicon substrate 102 using a known method. Subsequently, the high-K gate dielectric material 106 is formed on the entirety of the surface of the substrate (FIG. 2B). The high-K gate dielectric material 106 is formed by the ALD method. Details of the method of depositing the high-K gate dielectric material 106 will be described later.

Figure 2C:
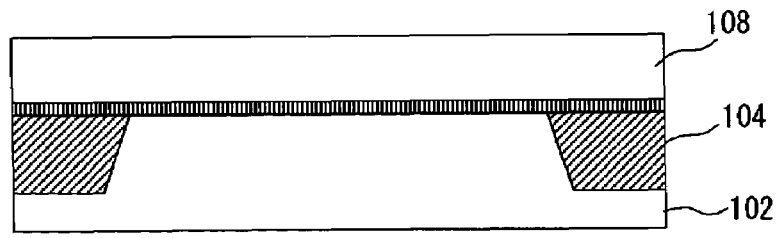
Figure 2D:
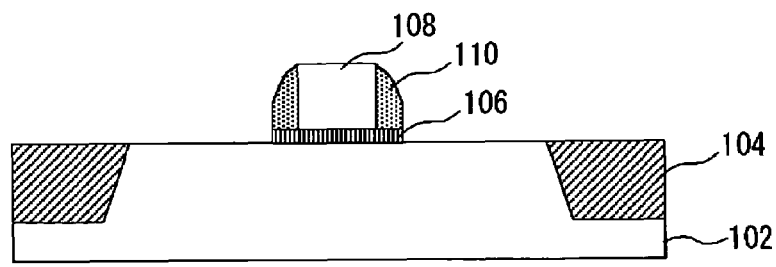
Figure 2E:
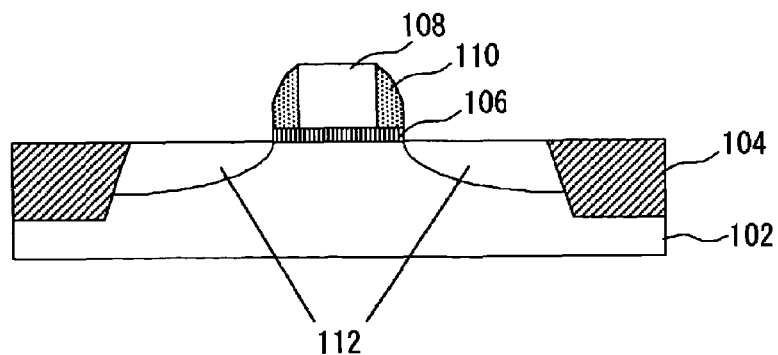

Subsequently, the gate electrode 108 is deposited on the high-K gate dielectric material 106 (FIG. 2C). The gate electrode 108 and the high-K gate dielectric material 106 are selectively removed (patterning). Subsequently, the side wall 110 is formed lateral to the gate electrode 108. This completes the formation of a gate (FIG. 2D). Subsequently, impurities are introduced below those portions of the surface of the silicon substrate 102 immediately beside the gate electrode so as to form a pair of source and drain 112 (FIG. 2E). This completes the process of fabricating a MIS transistor.

Figure 3:
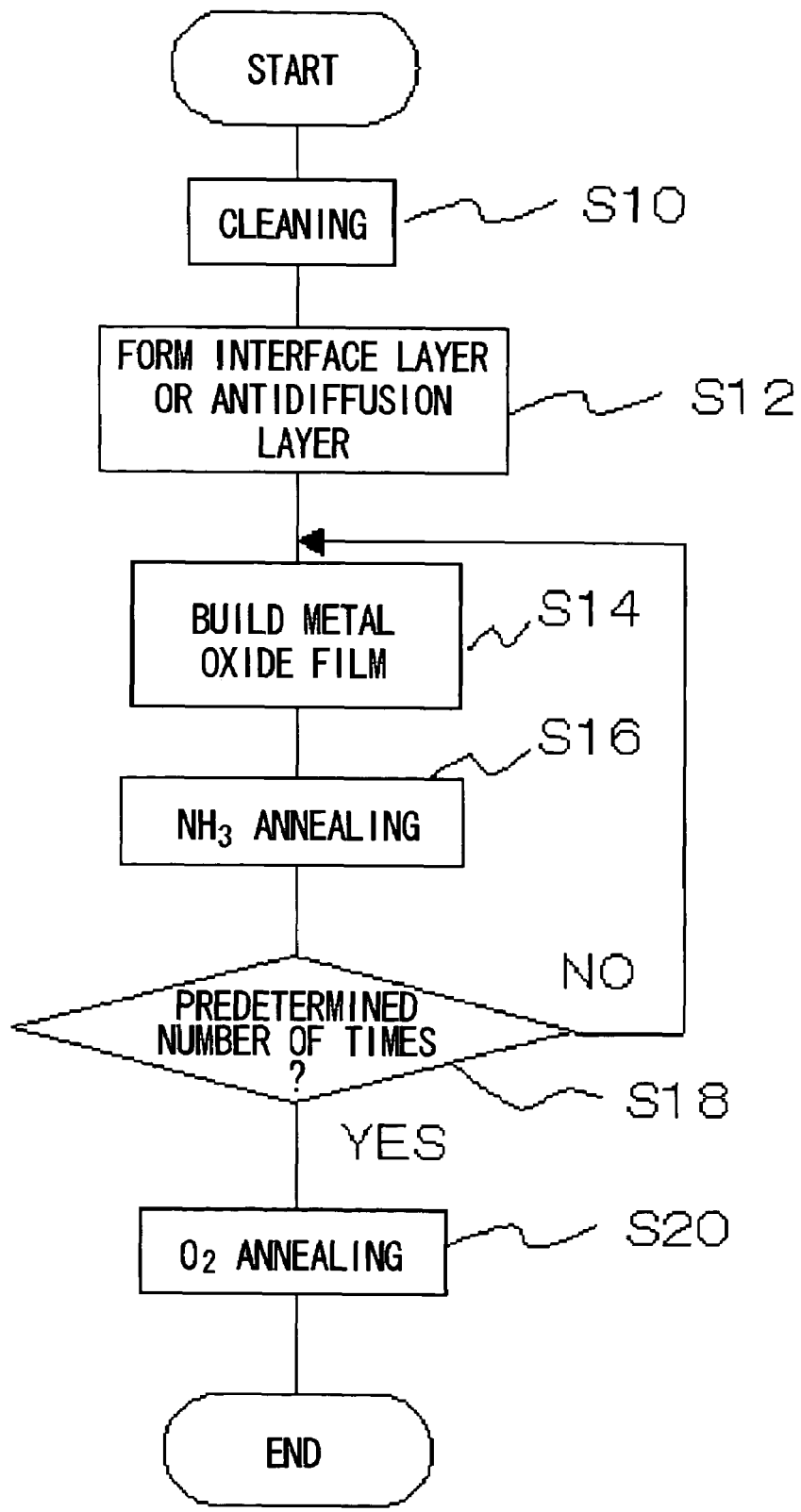
FIG. 3 is a flowchart showing a process of depositing the high-K gate dielectric material according to the embodiment.

A description will now be given of a method of depositing the high-K gate dielectric material 106 in the process described above. FIG. 3 is a flowchart showing a process of depositing the high-K gate dielectric material according to the embodiment.

First, the surface of the silicon substrate 102 is cleaned by HF (S10). Subsequently, an interface layer is formed on the surface of the silicon substrate 102 (S12). The interface layer may be a silicon oxide film formed by thermal oxidation. With this, the interface states are reduced so that the transistor performance is improved. The antidiffusion film 105 may be formed in step 12. When a capacitor insulator is formed, the process in step 12 may be omitted. Subsequently, a metal oxide film is built on the interface layer (S14). The metal oxide film is formed by supplying a film material to the surface of the silicon substrate 102 in a condition in which the temperature of the silicon substrate 102 is appropriately controlled. The film material is a metallic compound. For example, when an aluminium oxide film is formed, the material is trimethylaluminum (TMA). When a $ZrO_2$ film is deposited, a source gas such as zirconium chloride ($ZrCl_4$) may be selected for use. When an $HfO_2$ film is deposited, a source gas such as hafnium chloride ($HfCl_4$) or hafnium isopropoxide ($Hf(iOPr)_4$) may be used. When a HfAlO film is deposited, a source gas such as trimethylaluminum (TMA) or hafnium chloride ($HfCl_4$) may be used. $Hf[N(CH_3)_2]_4$ or $Hf[N(C_2H_5)_2]_4$ may be used as a source of Hf.

After forming the metal oxide film, the film is annealed in an atmosphere including nitride compound (S16). Annealing is done in an ammonia ($NH_3$) atmosphere. As a result of ammonia annealing, nitrogen is introduced into the metal oxide film, thus forming a metal oxynitride film. In this embodiment, the temperature in ammonia annealing may be higher than 650° C. More preferably, the temperature may be 700° C. or higher or 750° C. or higher. With this, the nitrogen content in the metal oxynitride film is increased. By subjecting the film to ammonia annealing in such a temperature range, the metal oxynitride film in an amorphous state is formed. By forming the metal oxynitride film in an amorphous state, a low dielectric constant layer at the interface between the metal oxynitride film and the silicon substrate 102 underneath is prevented from being formed when the metal oxynitride film is annealed in an oxidizing gas atmosphere in a subsequent process. The maximum temperature for ammonia annealing may be desirably chosen as long as the film performance of the high-K gate dielectric material 106 is not impaired. For example, the temperature may be 1050° C. or lower. Preferably, the temperature is 950° C. or lower. With this, the metal oxynitride film thus formed is prevented from being crystallized.

By repeating the processes off step 14 and step 16 a predetermined number of times, the high-K gate dielectric material 106 of a predetermined thickness is formed (Yes of S18) The film is then annealed in an oxidizing gas atmosphere (S20) The oxidizing gas may be $O_2$, No, $N_2O$ or the like that includes oxygen atoms. Of these, it is preferable that oxygen gas is used. The high-K gate dielectric material 106 is oxidized for a second time by the oxidizing gas. In this case, annealing is done in a oxygen atmosphere. In this embodiment, the temperature at oxygen annealing may be higher than 650° C. The temperature may be 700° C. or higher. More preferably, the temperature is 850° C. or higher. With this, the gate leak current is more favorably controlled. The maximum temperature at oxygen annealing may be desirably chosen as long as the film performance of the high-K gate dielectric material 106 is not impaired. For example, the temperature may be 950° C. or lower. With this the metal oxide film is prevented from being crystallized. The duration of oxygen annealing may be 1-600 seconds. As mentioned later, the gate leak characteristics of the film immediately after ammonia annealing at a high temperature tend to be relatively poor. This is presumably because, when nitrogen is introduced in an area in the vicinity of a metal, the area becomes conductive so that a leak current is more likely to be produced. By subjecting the film to oxygen annealing in the temperature range described above, bonding of metallic nitrides that induces conductivity, a cause of a leak path, is controlled. Moreover, impurities are successfully removed from the film and oxygen atoms are introduced into defects in the film. With this, the gate leak current in the high-K gate dielectric material 106 is favorably controlled.

Subsequently, the gate electrode 108 formed of a polysilicon layer is deposited.

Figure 4:
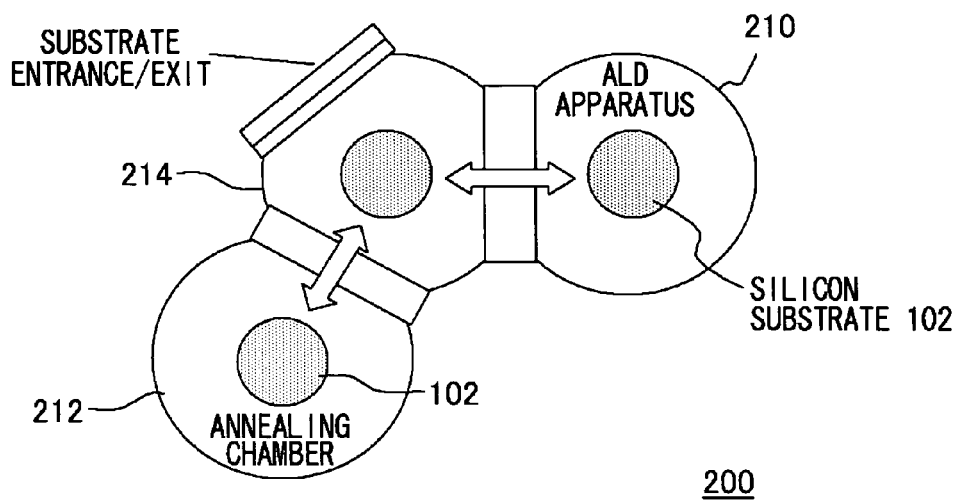
FIG. 4 is a schematic diagram showing a construction of a film deposition apparatus for forming a high-K gate dielectric film.

FIG. 4 shows an example a film deposition apparatus implementing the above process. In the film deposition apparatus 200 illustrated, an ALD apparatus 210 forming a metal oxide film and an annealing chamber 212 for lamp annealing communicate with each other via a load lock chamber 214.

Therefore, consecutive processing that does not require the silicon substrate 102 be exposed to the atmosphere is possible.

FIFTH EXAMPLE

An MIS transistor of a structure shown in FIG. 1A is fabricated. The process of fabricating the transistor is similar to the one described in the embodiment by referring to FIGS. 2A-2E. The high-K gate dielectric material 106 is produced according to a procedure described by referring to FIG. 3. The high-K gate dielectric material 106 is deposited by the widely practiced ALD method using the film deposition apparatus 200 shown in FIG. 4.

In this example, a HfAlON film was deposited as the high-K gate dielectric material 106. First, the silicon substrate 102 was cleaned by diluted hydrofluoric acid (DHF) and introduced into the load lock chamber 214 of the film deposition apparatus 200. Subsequently, the silicon substrate 102 was transported to the annealing chamber 212. The silicon substrate 102 was annealed for about 30 seconds in an oxygen atmosphere at about 850-950° C. so as to form a silicon oxide film (interface layer) on the silicon substrate 102. Consequently, the silicon oxide film of a physical thickness of about 1.0-2.0 nm was formed.

Figure 5:
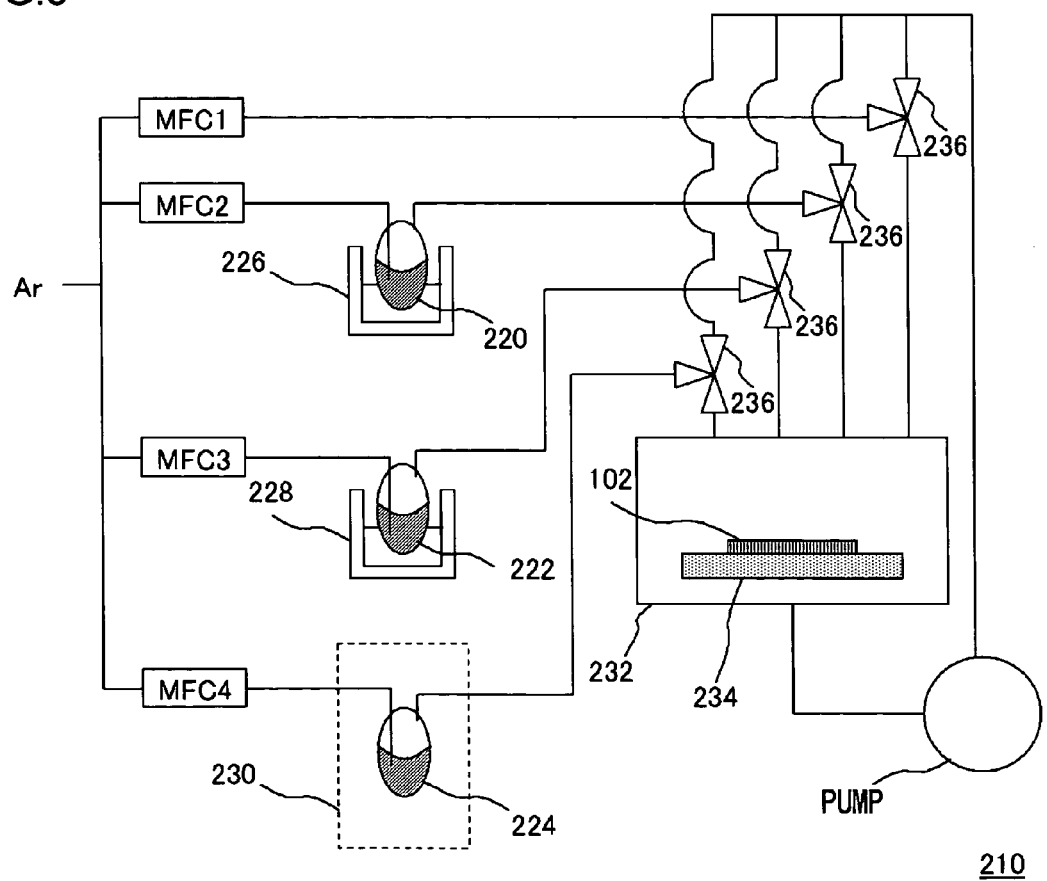
FIG. 5 is a schematic diagram showing a construction of a film deposition apparatus for forming a high-K gate dielectric film.

Subsequently, the silicon substrate 102 was transported into the ALD apparatus 210. FIG. 5 is a schematic diagram showing the ALD apparatus used in the fifth example. The ALD apparatus 210 includes a source tank 220 for $H_2O$, an oxidizer, a source tank 222 for trimethylaluminum (TMA: $Al(CH_3)_3$), a source for Al and a source tank 224 for Tetrakis dimethylamino hafnium (TDMAH: $Hf[N(CH_3)_2]_4$), a source for Hf. The source tanks 220-224 are maintained at a constant temperature of about 25° C., 20° C. and 60° C., respectively, by a constant temperature bath 226, a constant temperature bath 228 and a constant temperature bath 230, respectively. The silicon substrate 102 was transported to a film deposition chamber 232 of the ALD apparatus 210. A resistance heater 234 provided in the film deposition chamber 232 maintained the silicon substrate 102 at a temperature of about 200-300° C. Argon gas was used as a carrier gas or a purge gas for the respective sources. The flow rate of gas was controlled using mass flow controllers ($MFC_{1-4}$) Valves were used to switch between source gases introduced into the film deposition chamber 232. TMA, a purge gas, a $H_2O$ gas, a purge gas, TDMAH, a purge gas, a $H_2O$ gas and a purge gas were introduced in the stated order. This process is repeated several times.

Figure 11:
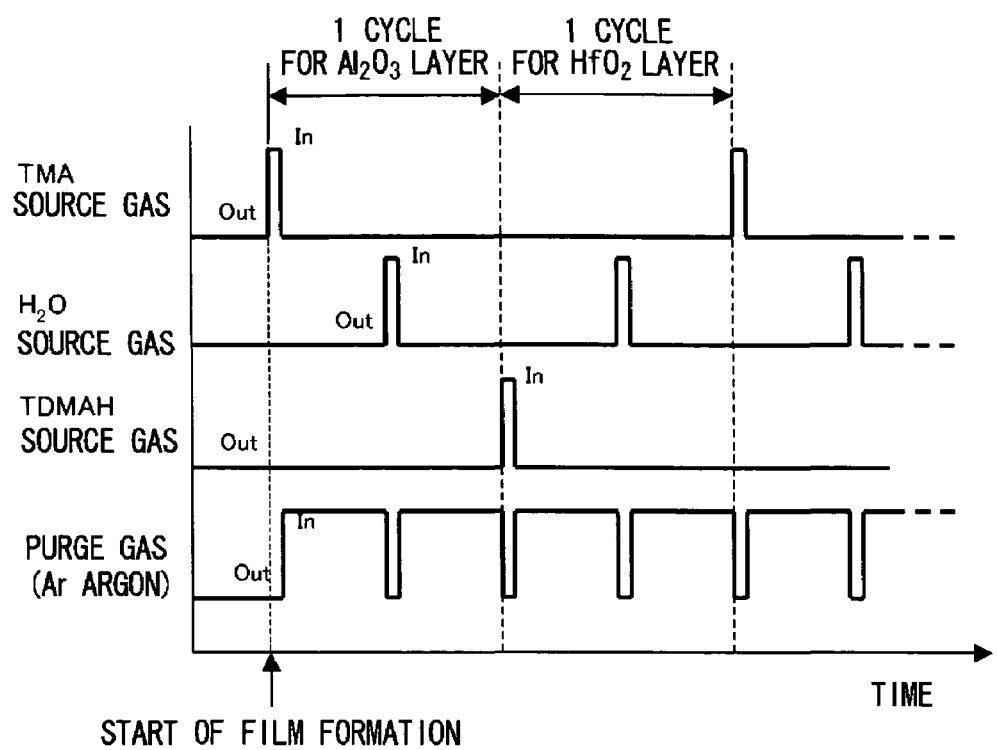
FIG. 11 shows a pattern of introducing a gas.

FIG. 11 shows a pattern of introducing gases. First, an $AL_2O_3$ layer was formed and then a $HfO_2$ layer was formed. By repeating this process, a HfAlOx of a thickness of about 0.8 nm was formed. Subsequently, the silicon substrate 102 was transported to the annealing chamber 212 and subjected to ammonia annealing for about 30 seconds in an ammonia ($NH_3$) atmosphere of 850° C. Thus, the metal oxynitride film HfAloN was formed. The ALD apparatus 210 then formed a HfAlOx layer of a thickness of about 0.8 nm, which was then annealed in the same condition as described above in the annealing chamber 212. By repeating the process five times, the HfAlON film of a thickness of about 4.0 nm was formed.

Subsequently, oxygen annealing (oxygen gas, 30 seconds) was done at 850° C. Thus, the high-K gate dielectric material 106 was formed. Subsequently, a polysilicon layer is built upon the material so as to form the gate electrode 108.

FIRST EXAMPLE

A transistor was fabricated in a process similar to the process of the fifth example except that the ammonia annealing temperature is 650° C. and the oxygen annealing temperature is 650° C.

SECOND EXAMPLE

A transistor was fabricated in a process similar to the process of the fifth example except that the ammonia annealing temperature is 750° C. and the oxygen annealing temperature is 650° C.

THIRD EXAMPLE

A transistor was fabricated in a process similar to the process of the fifth example except that oxygen annealing temperature is 650° C.

FOURTH EXAMPLE

A transistor was fabricated in a process similar to the process of the fifth example except that the ammonia annealing temperature is 950° C. and the oxygen annealing temperature is 650° C.

Figures 6, 7:
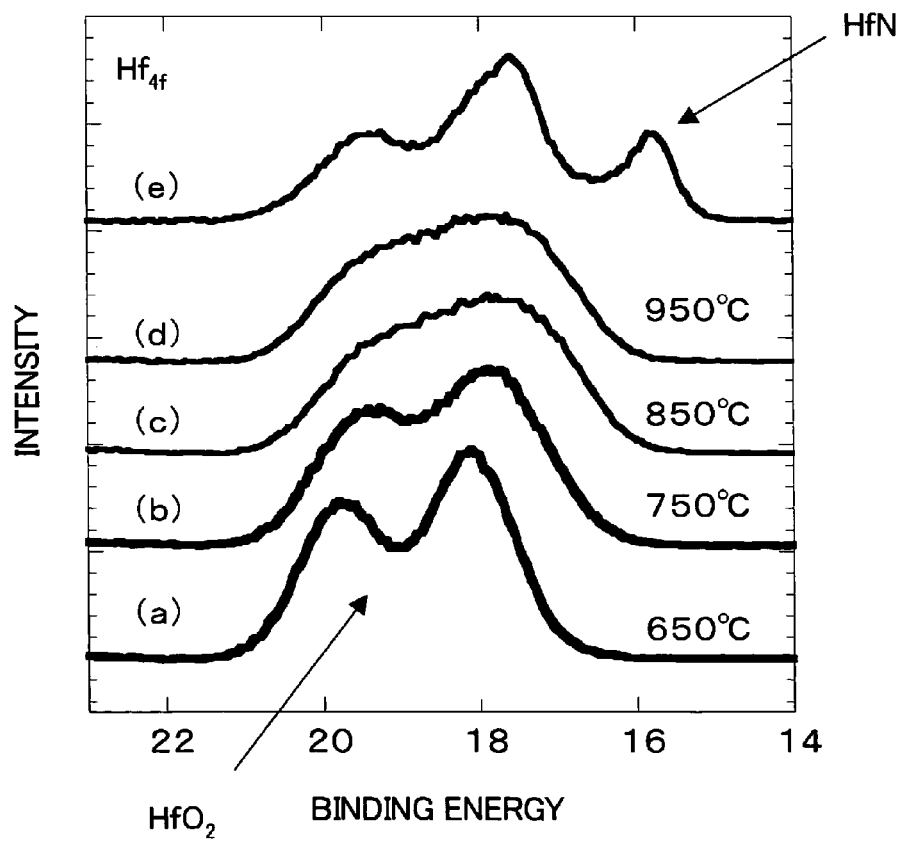
FIG. 6 lists the percentage content (atomic percentage) of nitrogen in the high-K gate dielectric material fabricated in the first through fourth examples.
FIG. 7 is an XPS (X-ray photoelectron spectroscopy) spectral diagram of an Hf4f of the high-K gate dielectric material fabricated in the first through fourth examples.

FIG. 6 lists the percentage content (atomic percentage) of nitrogen in the high-K gate dielectric material 106 fabricated in the fifth example and the first through fourth examples. The percentage content of nitrogen in the high-K gate dielectric material 106 was determined from results of XPS analysis. As listed in the second example, by controlling the ammonia annealing temperature at 750° C., the density of nitrogen is increased five times as high as compared to when the temperature is controlled at 650° C. (first example), proving that nitrogen is introduced efficiently. In the fifth example, the second through fourth examples, nitrogen was distributed in the high-K gate dielectric material 106 substantially evenly.

The results above show that it is possible to introduce high-density nitrogen in the metal oxide film by maintaining the ammonia annealing temperature at a relatively high level (for example, higher than 650° C.).

FIG. 7 is an XPS spectral diagram of Hf4f of the high-K gate dielectric material 106 fabricated in the first through fourth examples. The high-K gate dielectric material 106 fabricated in the first through fourth examples produced spectral lines (a)-(d) of FIG. 7. A spectral line (e) of FIG. 7 is an XPS spectrum of HfN of a powder type. Spectral peaks occurring at a binding energy range between 15 eV and 17 eV are observed when Hf atoms are surrounded only by nitrogen atoms. When the high-K gate dielectric material 106 has a structure as described above, the leak current of the high-K gate dielectric material 106 is increased. As described above, by subjecting the high-K gate dielectric material 106 to ammonia annealing, nitrogen is introduced therein. The resultant XPS spectral lines of (a)-(d) of FIG. 7 do not have spectral peaks at a binding energy range between 15 eV and 17 eV. This shows that introducing nitrogen in the film by ammonia annealing results in a structure in which nitrogen is dispersed, and oxygen atoms and nitrogen atoms are dispersed around Hf. By producing this structure, metallic binding in HfAlON is prevented from being generated so that the gate leak current is prevented from being increased.

An examination of the cross section using a transmission electron microscope (TEM) revealed that the high-K gate dielectric material 106 according to the fifth example and the second through fourth examples is in an amorphous state. By ensuring that the temperature for ammonia annealing is within the above-described range, it is ensured that the high-K gate dielectric material 106 is in an amorphous state and a thermally stable high-K gate dielectric material is obtained.

By subjecting the film to ammonia annealing at a temperature of 750° C. or higher, the peaks around the binding energy of 18 eV and 20 eV, showing the presence of $HfO_2$, are shifted toward the lower energy side and the peaks blend into the general trend, as the temperature rises. These results show that, as the temperature for ammonia annealing is raised, oxygen is replaced by nitrogen in the HfAlON film, thereby causing $HfO_2$ to be decreased in amount.

Figure 8:
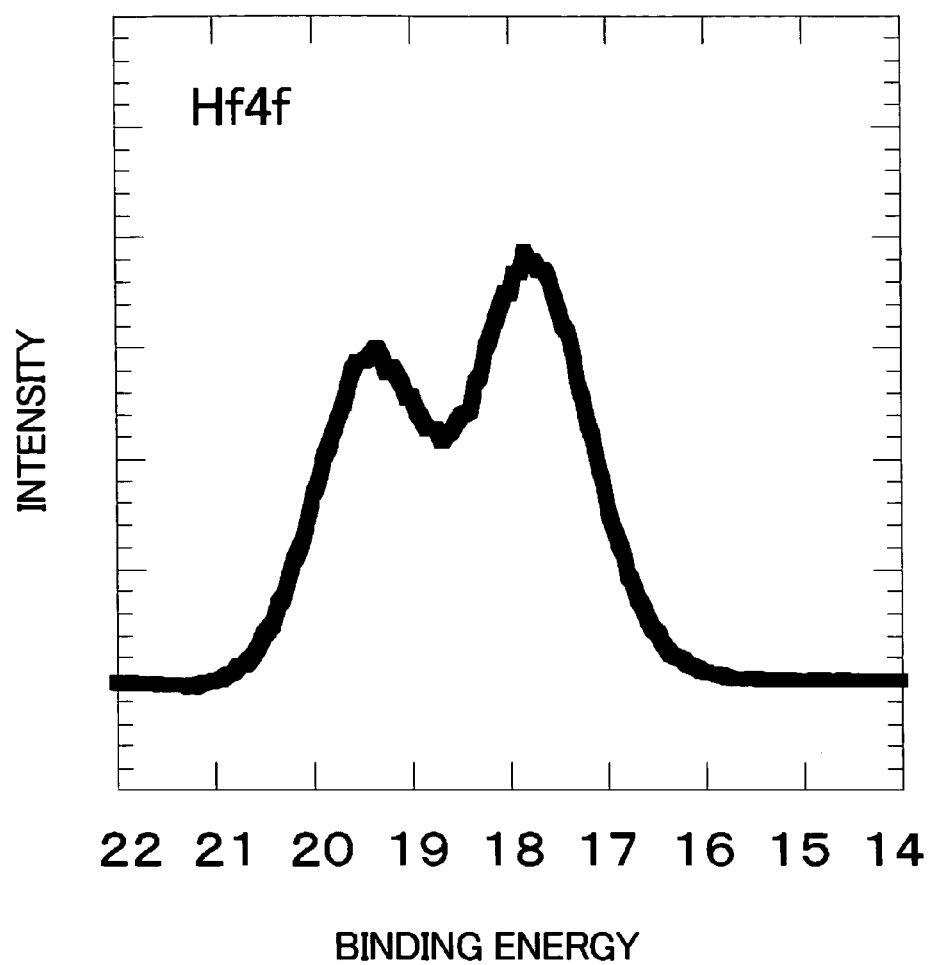
FIG. 8 is an XPS spectral diagram of an Hf4f of the high-K gate dielectric material fabricated in the fifth example.

FIG. 8 is an XPS spectral diagram of an Hf4f of the high-K gate dielectric material 106 fabricated in the fifth example. In this example, too, the XPS spectrum does not show any spectral peaks at a binding energy range between 15 eV and 17 eV. The peaks around the binding energy of 18 eV (17.5-18.5 eV) and 20 eV (19.5-20.5 eV), showing the presence of $HfO_2$, are clearly observed, the intensity ratio between the peak around 18 eV and the peak around 20 eV being 4:3.

Figure 9:
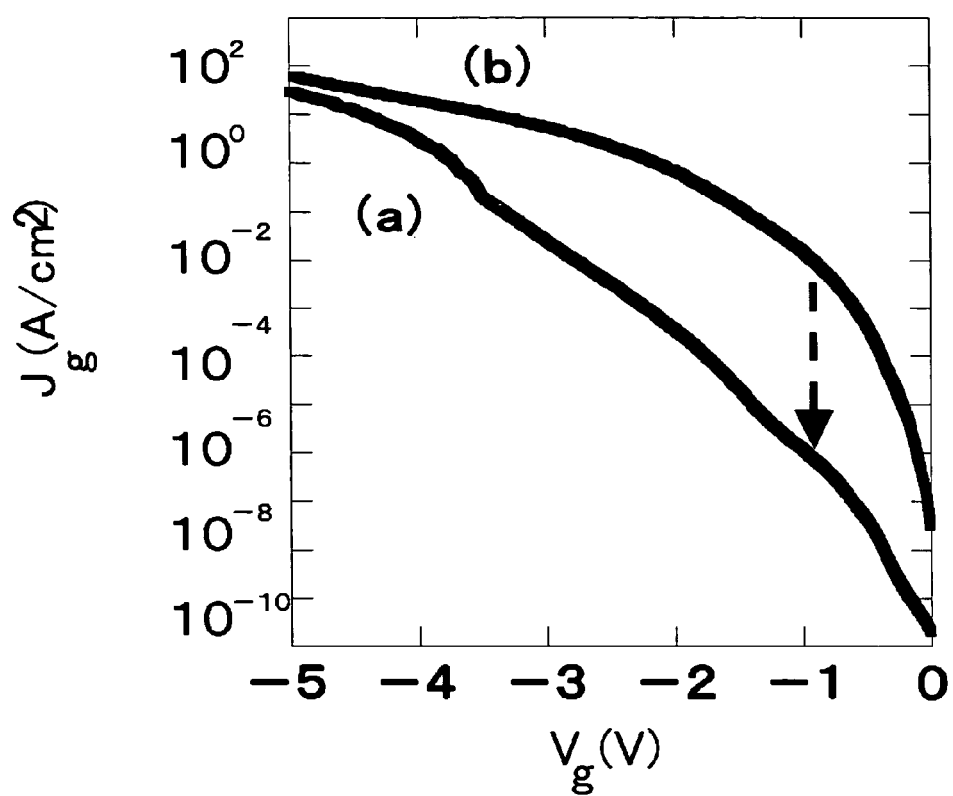
FIG. 9 is a graph showing a gate leak current of the transistor fabricated in the fifth example and the third example.
Figure 10A:
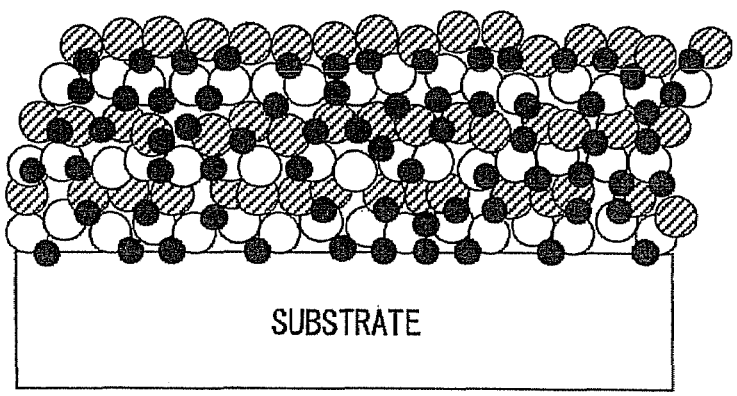
FIGS. 10A-10B show a problem that occurs in the related-art high-K gate dielectric material.
Figure 10B:
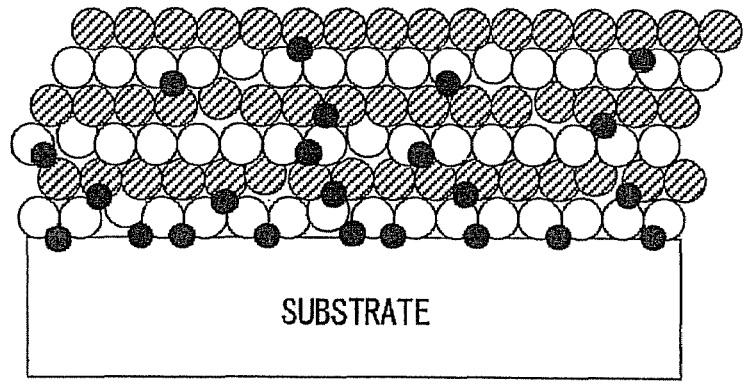

FIG. 9 is a graph showing a gate leak current of the transistor fabricated in the fifth example and the third example. Line (a) of FIG. 9 indicates a result derived from the fifth example and line (b) of FIG. 9 indicates a result derived from the third example. As illustrated, the level of gate leak current of the transistor fabricated in the fifth example at a given gate voltage is lower than that of the transistor fabricated in the third example. The gate leak current of the transistor fabricated in the fifth example is equal to or lower than that of the transistor fabricated in the first example. As the density of nitrogen in the high-K gate dielectric material 106 is increased and nitrogen atoms are located around Hf, bonding of metal nitrides that induces conductivity, a cause of leak path in HfALON, is partially created so that a leak current is more likely to be produced. Since oxygen annealing is done at a high temperature in this example, the film is re-oxidized, binding of metal oxides is reduced in scale and the number of defects in the film is decreased. This is considered as a reason why the film quality is improved, and the leak current is controlled at a relatively low level despite the fact that the percentage content of nitrogen is higher than the film of the first example. When the oxygen annealing temperature is 750° C. or 950° C., the same result as obtained in the first example was obtained.

The results described above showed that high-density nitrogen is distributed evenly in the high-K gate dielectric material 106 by subjecting the film to ammonia annealing at a high temperature (for example, higher than 650° C.). It was also proved that, by ensuring that the oxygen annealing temperature is high (for example, higher than 650° C.), the gate leak current is decreased.

Referring to FIG. 8, distinct peaks of binding energy indicating the presence of $HfO_2$ are observed. This indicates that the high-K gate dielectric material 106 is re-oxidized and the quality of the high-K gate dielectric material 106 is improved, by increasing the temperature at oxygen annealing.

Described above is the embodiment and examples of practicing the present invention. The embodiment and examples are only illustrative in nature and it will be obvious to those skilled in the art that various variations are possible within the scope of the present invention.

The high-K gate dielectric material that includes aluminum and hafnium was described in the embodiment. Alternatively, various metallic compound layers formed of elements such as Zr, lanthanoids such as La, Si and Y may be used.

More specifically, metal oxides such as $ZrO_2$, $HfO_2$, $(Zr,Hf)O_2$, $Al_2O_3$, $Y_2O_3$ and $LaOx$ may be used. Metal oxynitrides in which nitrogen is introduced in these metal oxides may also be used. Alternatively, silicon may be introduced as required in these metallic compounds. A combination of these metals may also be used.

Like the case of Hafnium, crystallization of these metal oxides is prevented from occurring and the amount of nitrogen introduced is increased, by ammonia annealing at a predetermined temperature. Transition metals such as Zr, lanthanoids such as La, and Y are characterized by loose bonding with other atoms such as oxygen, like the case of hafnium. For this reason, nitrogen is properly introduced by ammonia annealing and oxygen is properly introduced by oxygen annealing. Consequently, the film quality is improved.

What is claimed is:

1. A method of fabricating a metal compound thin film comprising the steps of:
    forming an interface layer or an antidiffusion film on a substrate;
    forming a metal oxide film on the interface layer or the antidiffusion film by an atomic layer deposition method;
    a first annealing in which the metal oxide film in an atmosphere including a nitrogen compound gas is annealed at a temperature of 750° C.-950° C., so as to diffuse nitrogen in the metal oxide film and form a metal oxynitride film in an amorphous state; and
    a second annealing in which the metal oxynitride film is annealed in an atmosphere including an oxidizing gas at a temperature of 850° C.-950° C.,
    wherein said step of forming the metal oxide film and the step of forming the metal oxynitride film are repeated several times, whereupon said second annealing is performed.

2. The method of fabricating a metallic compound thin film according to claim 1, wherein the metal oxide film includes elements selected from a group comprising Hf, Zr, Al, Si, Y and lanthanoids.

3. A method of fabricating a semiconductor device including a step of forming a metallic compound thin film on a semiconductor substrate, wherein the metallic compound thin film is formed by a method according to claim 1.

4. A method of fabricating a semiconductor device comprising the steps of:
    forming a gate insulator and a conductive film on a semiconductor substrate in the stated order; and
    patterning the gate insulator and the conductive film so as to form a gate part, wherein
    the gate insulator is formed by a method of fabricating a metallic compound thin film according to claim 1.

* * * * *